United States Patent
Liu et al.

(10) Patent No.: US 9,658,538 B2
(45) Date of Patent: May 23, 2017

(54) SYSTEM AND TECHNIQUE FOR RASTERIZING CIRCUIT LAYOUT DATA

(71) Applicant: TAIWAN SEMICONDUCTOR MANUFACTURING COMPANY, LTD., Hsin-Chu (TW)

(72) Inventors: Pei-Yi Liu, Changhua (TW); Cheng-Chi Wu, Hsinchu (TW); Cheng-Hung Chen, Zhubei (TW); Jyuh-Fuh Lin, Chunan Township (TW); Wen-Chuan Wang, Hsinchu (TW); Shy-Jay Lin, Jhudong Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 177 days.

(21) Appl. No.: 14/576,388

(22) Filed: Dec. 19, 2014

(65) Prior Publication Data

US 2016/0180005 A1 Jun. 23, 2016

(51) Int. Cl.
*G06F 17/50* (2006.01)
*G03F 7/20* (2006.01)

(52) U.S. Cl.
CPC ...... *G03F 7/70508* (2013.01); *G03F 7/70291* (2013.01); *G03F 7/70383* (2013.01); *H01J 2237/31764* (2013.01)

(58) Field of Classification Search
CPC ..................................................... G03F 1/144
USPC .......................................................... 716/50
See application file for complete search history.

(56) References Cited

U.S. PATENT DOCUMENTS

| | | | | |
|---|---|---|---|---|
| 4,991,115 A * | 2/1991 | Guthrie | ................ | G06K 15/225 358/1.18 |
| 5,393,987 A * | 2/1995 | Abboud | ................ | B82Y 10/00 250/492.22 |
| 5,768,437 A * | 6/1998 | Monro | .................... | G06T 9/001 358/426.14 |
| 2004/0075064 A1* | 4/2004 | Magoshi | ................ | B82Y 10/00 250/492.22 |
| 2005/0285054 A1* | 12/2005 | Inoue | .................... | B82Y 10/00 250/492.22 |
| 2008/0142739 A1* | 6/2008 | Beaulieu | ................ | B82Y 10/00 250/492.2 |
| 2013/0320230 A1* | 12/2013 | Yoshikawa | ......... | H01J 37/3177 250/398 |

(Continued)

*Primary Examiner* — Suresh Memula
(74) *Attorney, Agent, or Firm* — Haynes and Boone, LLP

(57) ABSTRACT

A technique for converting design shapes into pixel values is provided. The technique may be used to control a direct-write or other lithographic process performed on a workpiece. In an exemplary embodiment, the method includes receiving, at a computing system, a design database specifying a feature having more than four vertices. The computing system also receives a pixel grid. A set of rectangles corresponding to the feature is determined, and the computing system determines an area of a pixel of the pixel grid overlapped by the feature based on the set of rectangles. In some such embodiments, a lithographic exposure intensity is determined for the pixel based on the area overlapped by the feature, and the lithographic exposure intensity is provided for patterning of a workpiece.

20 Claims, 10 Drawing Sheets

(56) References Cited

U.S. PATENT DOCUMENTS

| | | | |
|---|---|---|---|
| 2015/0117768 A1* | 4/2015 | Chang | G06T 11/203 |
| | | | 382/162 |
| 2015/0242563 A1* | 8/2015 | Wieland | G03B 27/42 |
| | | | 438/798 |
| 2016/0012170 A1* | 1/2016 | Platzgummer | H01J 37/3026 |
| | | | 250/396 R |
| 2016/0071684 A1* | 3/2016 | Platzgummer | H01J 37/3045 |
| | | | 250/396 R |

* cited by examiner

Shape 302A: {(8,1) (12,7)}
Shape 302B: {(2,1) (6,1) (6,10) (7,10) (7,13) (1,13) (1,10) (2,10)}

Shape 302A: {(8,1) (12,7)}
Shape 302B: {(2,1) (6,1) (6,10) (7,10) (7,13) (1,13) (1,10) (2,10)}

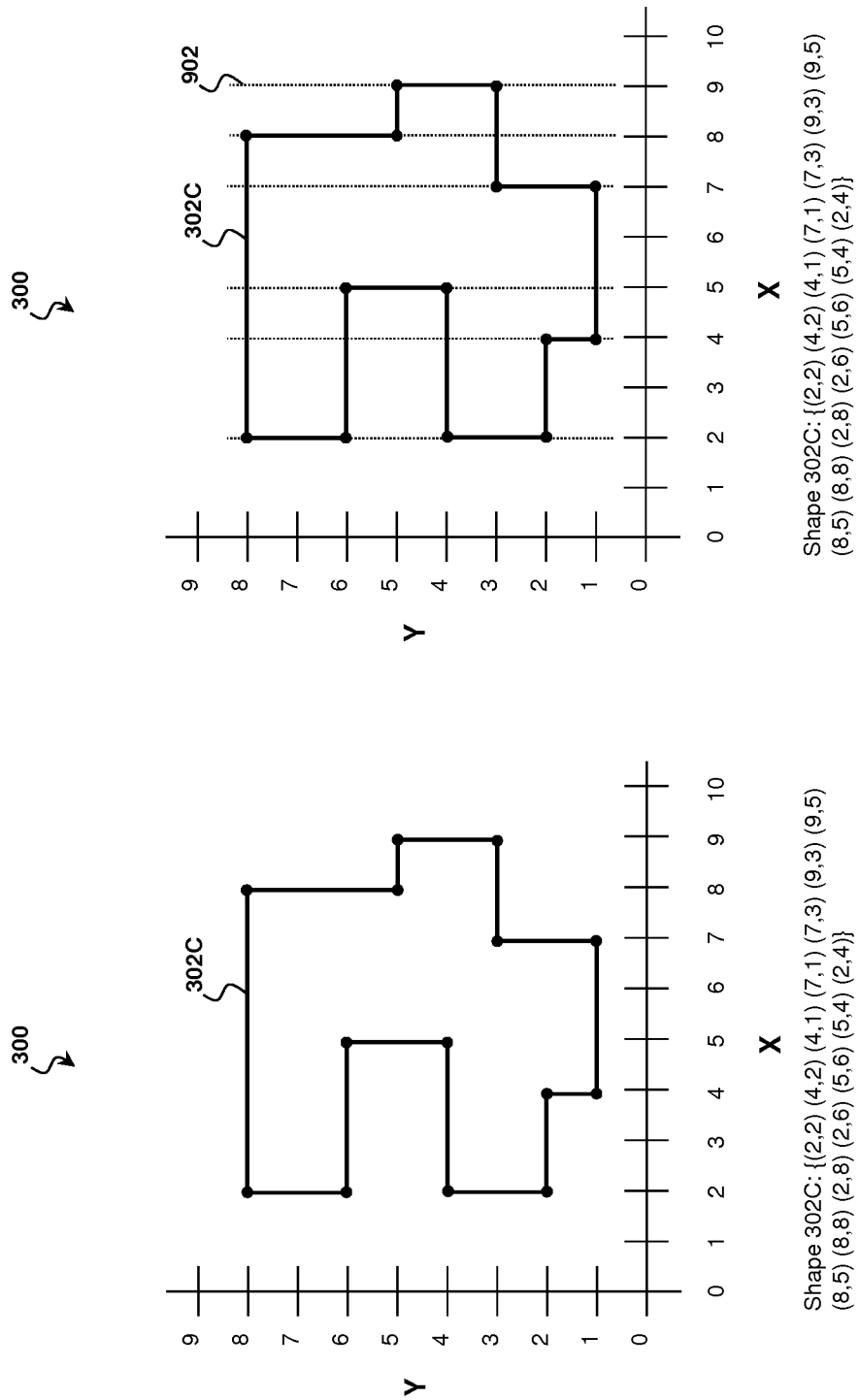

SYSTEM AND TECHNIQUE FOR RASTERIZING CIRCUIT LAYOUT DATA

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

As merely one example, advances in lithography have been important to reducing device size. In general, lithography is the transfer of a pattern onto a target. In one type of lithography, referred to as photolithography, radiation such as ultraviolet light passes through or reflects off a mask before striking a photoresist coating on target. Lithography transfers a pattern from the mask onto the photoresist, which is then selectively removed to reveal the pattern. The target then undergoes processing steps that take advantage of the shape of the remaining photoresist to create features on the target. Another type of lithography, referred to as direct-write lithography, uses a laser, an electron beam (e-beam), ion beam, or other narrow-focused emission to expose a resist coating or to pattern a material layer directly. E-beam lithography is one of the most common types of direct-write lithography, and, by directing a collimated stream of electrons to the area to be exposed, can be used to remove, add, or otherwise change a material layer with incredible accuracy.

While precise, the narrow focus often makes direct-write lithography slower than photolithographic methods. Additionally, direct-write lithography may be computationally intensive. For example, the computing resources required to convert a design into a set of intensity values used to control the direct-write emitter may be significant. Therefore, while existing lithographic techniques have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8-12 are representations of a design database undergoing the method for decomposing a polygon into its constituent rectangles according to various aspects of the present disclosure.

DETAILED DESCRIPTION

Figure 1:
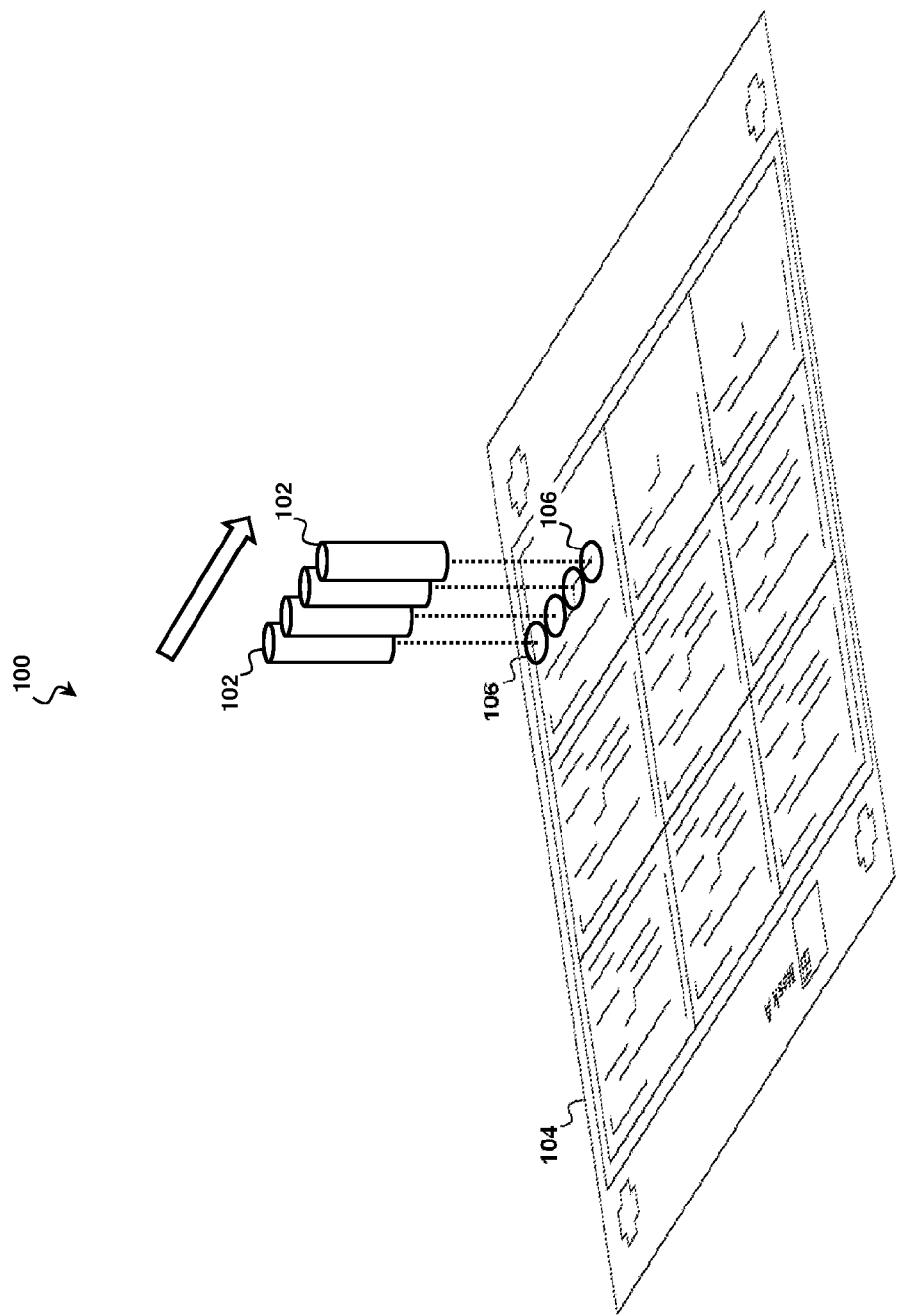
FIG. 1 is a perspective view of a direct-write system according to various aspects of the present disclosure.

The present disclosure relates generally to IC device manufacturing and, more particularly, to a system and technique for rasterizing polygons of a circuit layout into a pixel grid such as that used for direct-write lithographic process.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a perspective view of a lithographic system 100 according to various aspects of the present disclosure. In some embodiments, the lithographic system 100 includes a direct-write system such as an e-beam, ion-beam, laser writer and/or other suitable direct-write system. FIG. 1 has been simplified for the sake of clarity and to better illustrate the concepts of the present disclosure.

The lithographic system 100 includes one or more energy emitters 102. In various embodiments, the energy emitters 102 include electron beam emitters, ion beam emitters, laser emitters, and/or other suitable emitting devices and may include both a beam source and a plurality of electromagnetic and/or optical lenses. The energy emitters 102 are aligned such that the emitted energy impacts a workpiece 104 at precise focal points 106 (enlarged for clarity). The focal points 106 are scanned along the surface of the workpiece 104 by moving the emitters 102 and/or by moving the workpiece 104. By varying the intensity of the energy emitter(s) 102, the exposure dosage at the focal points 106 can be controlled. To provide additional granularity, multiple emitters 102 or multiple passes may be used to expose a region more than once. The exposure doses are cumulative and by independently controlling the dosage of each exposure, a number of different exposure intensities can be produced.

In this way, the energy emitters 102 of the lithographic system 100 produce a precise pattern on the surface of the workpiece 104. In some embodiments, the workpiece 104 is a lithographic mask and the patterning produces alternating absorptive and transmissive regions (for a transmissive mask) or absorptive and reflective regions (for a reflective mask). In some embodiments, the workpiece is a substrate such as a semiconductor substrate, and the patterning may be part of any number of semiconductor fabrication processes, including etching, deposition, doping, epitaxial growth, metallization, and/or other fabrication processes. In these applications and others, the lithographic system 100 may pattern the workpiece 104 by indirectly by exposing a resist, which is developed in order to expose regions of the workpiece to be processed (e.g., implanted, etched, etc.), and/or directly by adding or removing material from the workpiece 104.

Figure 2:
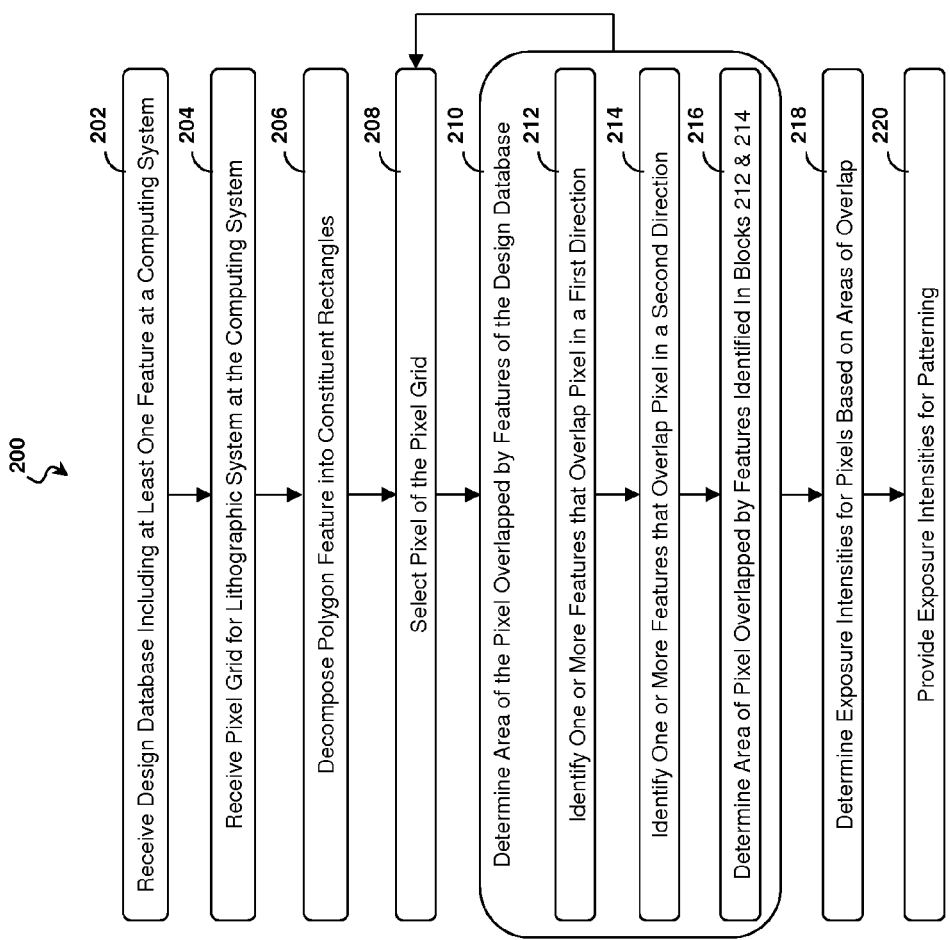
FIG. 2 is a flow diagram of a pixel-by-pixel method for rasterizing a design database according to various aspects of the present disclosure.

In many embodiments, a designer specifies the pattern to be formed rather than commanding the lithographic system 100 directly. A computing system typically receives the pattern in the form of a design database and converts the pattern into a map of exposure intensities across the workpiece 104 and ultimately into control signals for the energy emitters 102 of the lithographic system 100. Various examples of a technique for converting a design database into a set of exposure intensities are described with respect to FIGS. 2-4, 5A, and 5B. FIG. 2 is a flow diagram of a method 200 for rasterizing a design database according to various aspects of the present disclosure. It is understood that additional steps can be provided before, during, and after the method 200 and that some of the steps described can be replaced or eliminated for other embodiments of the method 200. FIGS. 3, 4, 5A, and 5B are representations of a design database 300 undergoing the rasterization method 200 according to various aspects of the present disclosure.

Figure 3:
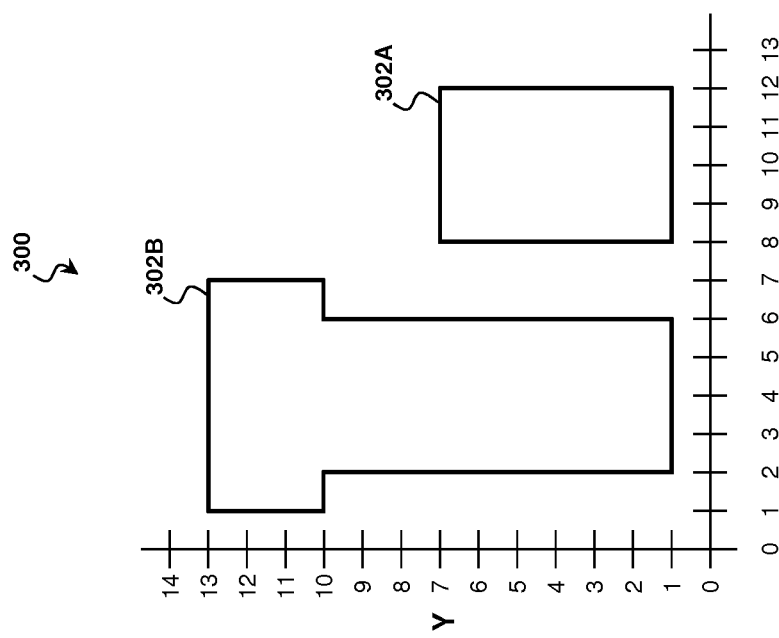

Referring to block 202 of FIG. 2 and to FIG. 3, a design database 300 is received at a computing system. The design database 300 includes any number of features (e.g., features 302A and 302B) to be formed on the workpiece and represents the features in the form of a data file stored on a non-transitory computer-readable medium. Various design standards exist for representing the features including GDSII, OASIS, CIF (Caltech Intermediate Form), and MEBES®, a registered trademark of Applied Materials, and in various embodiments, the design database 300 represents the features in these and/or other suitable formats. For ease of explanation, the features 302A and 302B in the illustrated embodiment are represented according to a simplified version of a design standard. However, the concepts and principles apply equally to design databases 300 represented in any and all suitable design standards, and no standard or database format is characteristic of or required for any embodiment.

Referring to FIG. 3, the design database 300 contains a number of features (including features 302A and 302B), each uniquely identified by sets of X,Y coordinates corresponding to vertices of the feature. For square or rectangular features, each feature may be specified using two X,Y coordinates corresponding to the diagonal vertices (e.g., $(min_x, min_y)$ $(max_x, max_y)$). For example, in the case of feature 302A, the feature can be unambiguously identified by the coordinates: {(8,1) (12,7)}. It is a trivial matter to determine the remaining vertices should they prove relevant to any determination.

For polygons that are not rectangles, each polygon may be specified by X,Y coordinates corresponding to some or all the vertices of the polygon. For example, in some embodiments, polygon features are specified by an ordered list of coordinates that trace the vertices moving in a clockwise or counterclockwise manner around the feature. In the case of feature 302B, the feature can be unambiguously identified by the coordinates: {(2,1) (6,1) (6,10) (7,10) (7,13) (1,13) (1,10) (2,10)} representing the vertices of the feature.

In many embodiments, the design database 300 specifies the features independent of the actual technique used to pattern the workpiece. In other words, the design database 300 may specify the features without accounting for any particular patterning technique used to form the features. In this way, the design database 300 may be suitable for use with a variety of photolithographic and direct write techniques, although additional conversion may be used in order to prepare the design database 300 for patterning. For example, feature vertices may not align to a grid used by the lithographic system. Some direct-write systems use a pixel grid, where each pixel is a region of uniform intensity and where the intensity of each pixel can be specified independent of adjacent pixels. The beam or beams of the direct-write system are controlled to produce the specified exposure intensity at the corresponding location of the workpiece 104. However, it is neither necessary nor particularly advantageous for the grid of the direct-write system to align with the vertices of the features in the design database 300.

Figure 4:
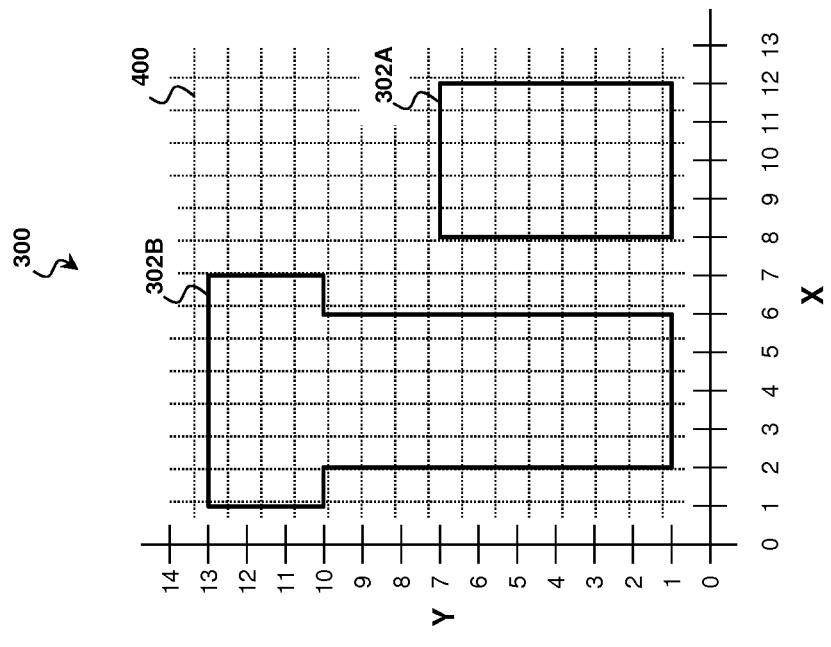
FIGS. 3, 4, 5A, and 5B are representations of a design database undergoing the rasterization method according to various aspects of the present disclosure.

Referring to block 204 of FIG. 2 and to FIG. 4, a pixel grid 400 is received at the computing system. The pixel grid 400 may be particular to and may be associated with a specific lithographic system, such as e-beam writer, a laser writer, an ion beam writer, etc. The pixel grid 400 specifies a set of pixels, each with an associated exposure intensity value. Each pixel has a uniform intensity value within the pixel, and each pixel may have an intensity independent from that of adjacent pixels. As part of a rasterization technique, intensity values are assigned to the pixels based on the features (e.g., features 302A and 302B) of the design database 300. The intensity value assigned to any particular pixel is based in part on the area of the pixel that overlaps a feature. In some exemplary embodiments, the intensity has a first-order relationship with the pixel area. For example, in some such embodiments, pixel intensity is determined by the equation: $I=\lambda A$, where I represents the intensity of a pixel, A represents the area of the pixel overlapped by a feature, and $\lambda$ represents a normalizing constant. In further embodiments, the intensity has a higher-order relationship, which may be expressed as:

$$I=\Sigma_{i=n}^{m}\lambda_i A^i$$

where I represents the intensity of a pixel, $A^i$ represents the area of the pixel overlapped by a feature raised to the power of i, $\lambda_i$ represents a normalizing constant for a polynomial order of i, and n and m are any arbitrary values. In the examples of FIG. 2, the intensity values are determined pixel-by-pixel, whereas in further embodiments described below the intensity values are determined feature-by-feature.

Figure 5B:
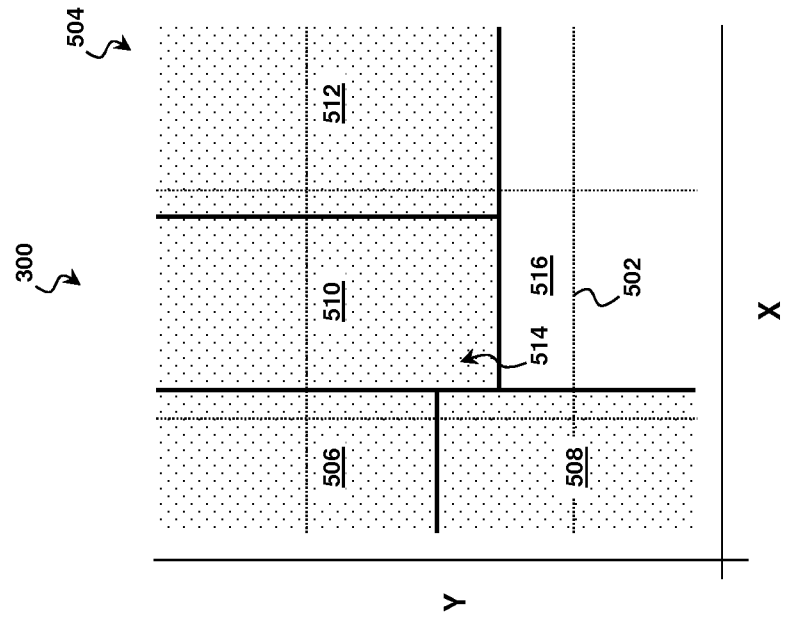
Figure 5A:
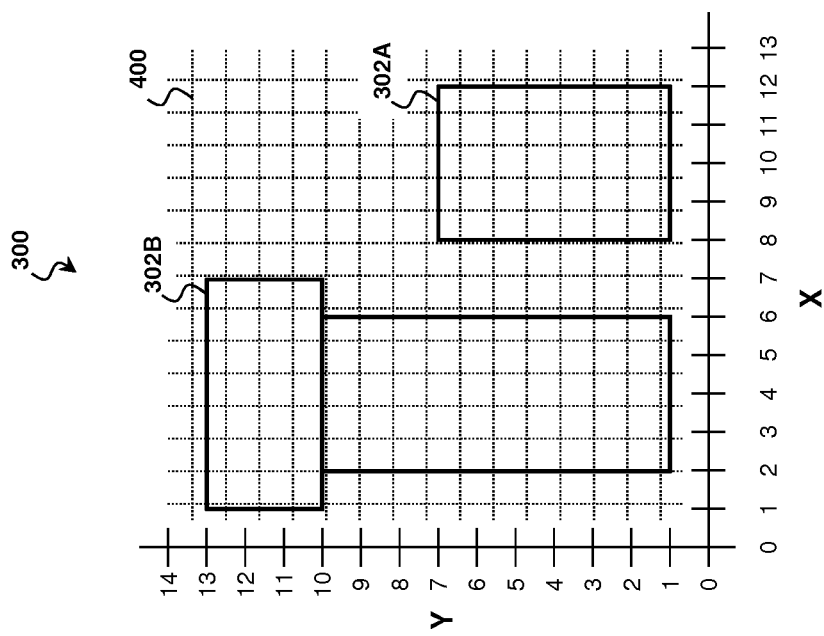

Referring to block 206 of FIG. 2 and to FIG. 5A, in order to simplify the area determination, in some embodiments, the computing system decomposes complex feature polygons, such as those that are not rectangular (e.g., having more than four vertices), into constituent rectangles. The constituent rectangles cover the same surface area as the corresponding polygon but are useful because determining the overlapping area of two rectangles (e.g., a pixel and a rectangular feature 302A) may require far fewer computational operations than determining the overlapping area of a rectangle and a polygon (e.g., feature 302B). In some embodiments, fracturing polygons may reduce the number of computational cycles by an order of magnitude or more. Decomposition techniques are described in more detail with specific examples below.

Referring to block 208 of FIG. 2, the computing system selects a pixel of the pixel grid 400, and referring to block 210, the area of the pixel that is overlapped by one or more of the features is determined based on the pixel boundary the feature boundaries. Overlap area may be determined by any suitable technique, some of which are described in blocks 212-216.

In the embodiments of blocks 212-216, the computing system winnows the number of features to be considered using one or more simple comparisons, so that complex comparisons are performed on fewer features. Referring to block 212 of FIG. 2, the computing system identifies those features in the design database 300 that overlap the pixel in a first direction (e.g., the X direction). In an embodiment, the design database 300 is analyzed to identify feature shapes that have at least one vertex with an X value of less than the maximum X value of the pixel and at least one vertex with an X value greater than the minimum X value of the pixel. Referring to block 214 of FIG. 2, the computing system identifies those features in the design database 300 that overlap the pixel in a second direction perpendicular to the first (e.g., the Y direction). In an embodiment, the design database 300 is analyzed to identify feature shapes that have at least one vertex with a Y value of less than the maximum Y value of the pixel and at least one vertex with a Y value greater than the minimum Y value of the pixel. Of course, the determinations of blocks 212 and 214 can be made in any order, and once a subset of features is identified as being potentially overlapping in one block, the analysis of the subsequent block may be limited to that subset.

Referring to block 216 of FIG. 2, the computing system determines the area of the pixel overlapped by the features. Because this can be computationally intensive, in some embodiments the determination is only made for those features identified as potentially overlapping in blocks 212 and 214. In addition, the computational burden can be further lessened by the decomposition of block 206 that replaces polygons with their constituent rectangles. Any of a number of techniques for determining overlapping area may be used. In an exemplary embodiment, the overlapping area of two rectangles is determined by:

$$A=[\min(P_{max}x, F_{max}x)-\max(P_{min}x, F_{min}x)]*[\min(P_{max}y, F_{max}y)-\max(P_{min}y, F_{min}y)]$$

where A represents the area of the pixel overlapped by a feature (e.g., feature 302A or 302B), $P_{max}x$ and $P_{max}y$ represent the maximum x and y coordinates of the pixel respectively, $P_{min}x$ and $P_{min}y$ represent the minimum x and y coordinates of the pixel respectively, $F_{max}x$ and $F_{max}y$ represent the maximum x and y coordinates of the feature respectively, and $F_{min}x$ and $F_{min}y$ represent the minimum x and y coordinates of the feature respectively.

Because the area of intersection between two rectangles (e.g., a pixel and a constituent feature rectangle) is also a rectangle, the overlapping area can be determined more easily than the area of intersection between a rectangle and a polygon (e.g., a pixel and a polygonal feature). This is explained in more detail with reference to FIG. 5B, where a portion of the design database 300 is enlarged to show the intersection between a pixel 502 of the pixel grid 400 and a feature 504 of the design database 300. For reference, the interior region of feature 504 is shaded. Constituent rectangles 506, 508, 510, and 512 of the feature 504 are also illustrated.

There are a number of techniques for determining the area of intersection from the polygon representation of the feature 504. However, many of these perform a complicated analysis of the portions of the polygon beyond the pixel 502 to determine whether the polygon is concave or convex within the pixel 502 area (i.e., to determine whether the intersecting area corresponds to region 514 or 516). For example, Sutherland-Hodgman clipping sorts the polygon vertices and creates a clipped polygon that cuts off a portion of the polygon beyond a boundary of the pixel 502, such as a minimum or maximum value of the pixel 502 in the x or y direction. The clipping is repeated for each boundary of the pixel 502. Because of the complexity of the clipping operations, Sutherland-Hodgeman and other polygon-based techniques involve an order of magnitude more calculations than rectangle-based overlap techniques. For example, in the illustrated embodiment of FIG. 5B, the overlapping area can be determined from the constituent rectangles 506, 508, 510, and 512 by applying the previously described equation:

$$A=[\min(P_{max}x, F_{max}x)-\max(P_{min}x, F_{min}x)]*[\min(P_{max}y, F_{max}y)-\max(P_{min}y, F_{min}y)]$$

or other suitable technique to each of the constituent rectangles 506, 508, 510, and 512 and summing the results. Because each rectangle has only four vertices, the sorting operation to determine minimum and maximum vertices is relatively undemanding especially when compared to polygon-based techniques.

The determination of block 216 may be repeated for each overlapping feature in the subset identified in blocks 212 and 214, and the determinations of blocks 208-216 may be repeated for each pixel in the pixel grid 400 to perform the pixel-by-pixel determination. For example, in the embodiment of FIG. 5B, the determinations of blocks 208-216 are repeated for other pixels. Referring to block 218, the computing system determines exposure intensities for the pixels of the pixel grid 400 based on the respective amounts of overlap determined in blocks 208-216. In some exemplary embodiments, the intensity has a first-order relationship with the pixel area. In further embodiments, the intensity has a higher-order relationship, which may be expressed as:

$$I=\Sigma_{i=n}^{m}\lambda_i A^i$$

where I represents the intensity of a pixel, $A^i$ represents the area of the pixel overlapped by a feature raised to the power of i, $\lambda_i$ represents a normalizing constant for a polynomial order of i, and n and m are any arbitrary values. Referring to block 220, the computing system provides exposure intensities to a lithographic system 100 for use in patterning a workpiece 104.

Figure 6:
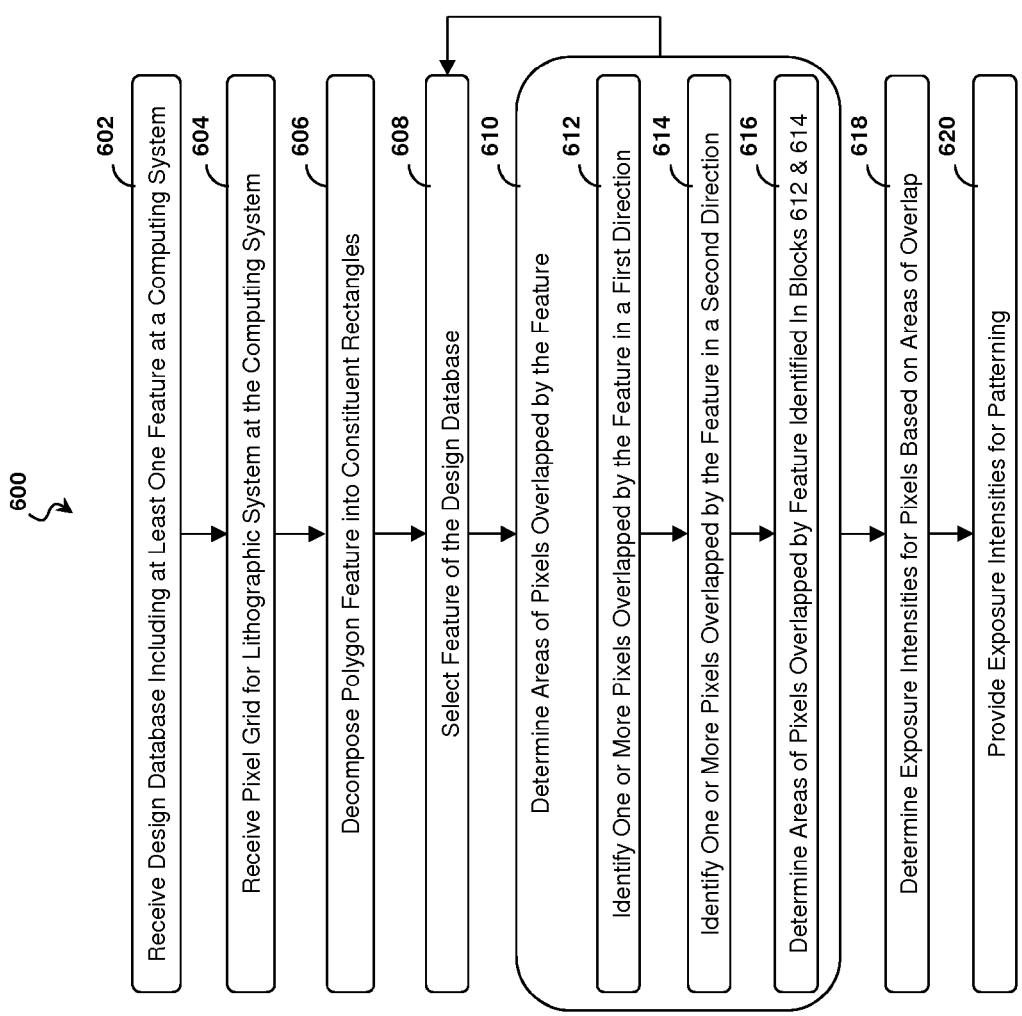
FIG. 6 is a flow diagram of a feature-by-feature method for rasterizing a design database according to various aspects of the present disclosure.

A similar feature-by-feature pixel intensity determination is described with reference to FIG. 6. FIG. 6 is a flow diagram of a method 600 for rasterizing a design database according to various aspects of the present disclosure. It is understood that additional steps can be provided before, during, and after the method 600 and that some of the steps described can be replaced or eliminated for other embodiments of the method 600.

Referring to block 602 of FIG. 6 and to FIG. 3, a design database 300 is received at a computing system. Referring to block 604 of FIG. 6 and to FIG. 4, a pixel grid 400 is received at the computing system. The design database 300 and the pixel grid 400 may be substantially similar to those described with reference to FIGS. 2-4. Referring to block 606 of FIG. 6 and to FIG. 5A, the computing system decomposes polygons of the design database 300 into constituent rectangles.

Referring to block 608 of FIG. 6, the computing system selects a feature of the design database 300, and referring to block 610, the computing system determines the area of those pixels overlapped by the feature based on the pixel boundaries and the feature boundary. Referring to block 612 of FIG. 6, the computing system identifies those pixels that overlap the feature in a first direction (e.g., the X direction). In one example, the pixel grid 400 is analyzed to identify pixels that have at least one corner at an X value of less than the maximum X value of the feature and have at least one corner at an X value greater than the minimum X value of the feature. Referring to block 614 of FIG. 6, the computing system identifies those pixels that overlap the feature in a second direction (e.g., the Y direction). In one example, the pixel grid 400 is analyzed to identify pixels that have at least one corner at a Y value of less than the maximum Y value of the feature and have at least one corner at a Y value greater than the minimum Y value of the feature. Of course, the determinations of blocks 612 and 614 can be made in any order, and once a subset of pixels is identified as being potentially overlapping in one block, the analysis of the subsequent block may be limited to that subset.

Referring to block 616 of FIG. 6, the computing system determines the area of the feature overlapping a given pixel. This may be performed substantially as described in block 216 of FIG. 2 or by any other suitable technique. Because this can be computationally intensive, in some embodiments the determination is only made for those pixels identified as potentially being overlapping in blocks 612 and 614. Accordingly, the determination of block 616 may be repeated for each pixel in the subset, and the determinations of blocks 608-616 may be repeated for each feature in the design database 300 to perform the feature-by-feature determination.

Referring to block 618, the computing system determines exposure intensities for the pixels of the pixel grid 400 based on the respective amounts of overlap determined in blocks 608-616, which may be performed substantially described in block 218 of FIG. 2. Referring to block 620, the computing system provides exposure intensities to a lithographic system 100 for use in patterning a workpiece 104.

Figure 7:
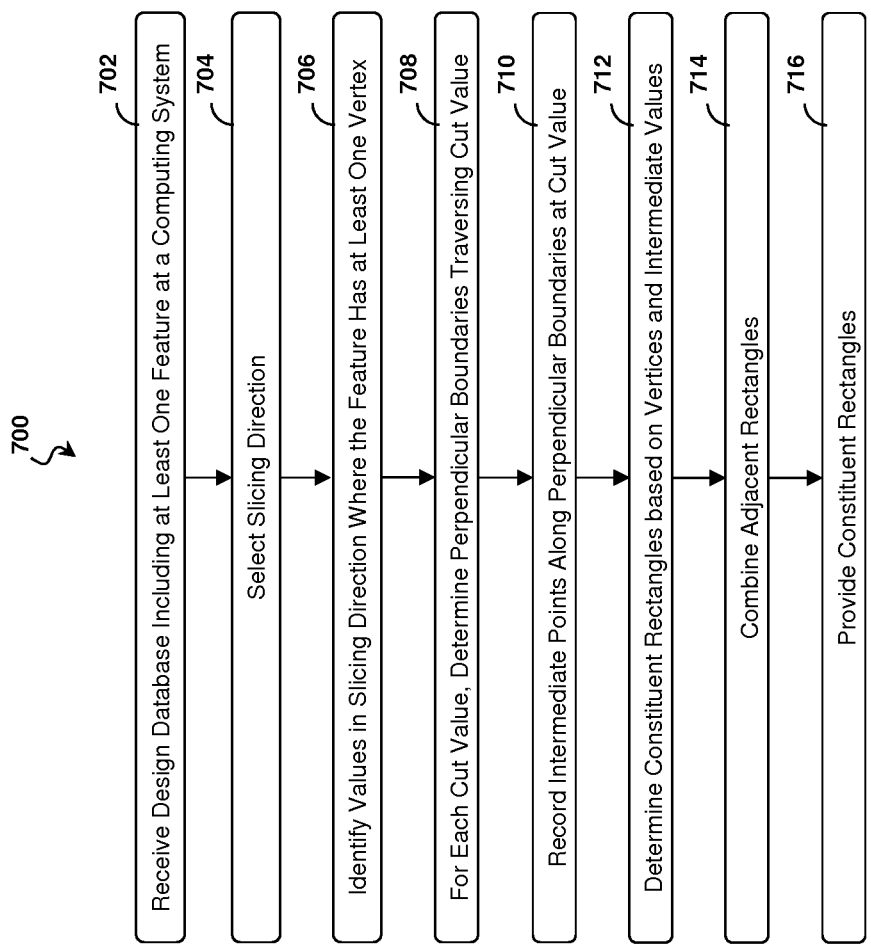
FIG. 7 is a flow diagram of a method for decomposing a polygon into a set of constituent rectangles according to various aspects of the present disclosure.

As discussed above, the method 200 of FIG. 2 and the method 600 of FIG. 6 may utilize a polygon decomposition technique in order to reduce the competition burden of determining the overlapping area between a pixel and a feature. One exemplary polygon decomposition technique is described with reference to FIGS. 7-12, although it is understood that any suitable technique for replacing a polygon with a set of constituent rectangles may be utilized in either method. FIG. 7 is a flow diagram of a method 700 for decomposing a polygon into a set of constituent rectangles according to various aspects of the present disclosure. It is understood that additional steps can be provided before, during, and after the method 700 and that some of the steps described can be replaced or eliminated for other embodiments of the method 700. FIGS. 8-12 are representations of a design database 300 undergoing the method 700 for decomposing a polygon into its constituent rectangles according to various aspects of the present disclosure.

Referring to block 702 of FIG. 7 and to FIG. 8, a design database 300 is received at a computing system. The design database 300 may be substantially similar to that described with reference to FIGS. 2-6 and includes a number of features for forming on a workpiece 104. For clarity, only a single feature 302C is illustrated, although it is understood that the design database 300 may include any number of features. The exemplary feature 302C is a polygon and is representative of any feature to be decomposed into its constituent rectangles. In that regard, a rectangular feature may be considered a degenerate case for which decomposition is trivial. In the embodiment of FIG. 8, the feature 302C is unambiguously identified by a set of coordinates corresponding to the vertices of the polygon, where the coordinates are arranged in the set by tracing the perimeter of the feature 302C in a counterclockwise manner. In the illustrated embodiment, these coordinates are: {(2,2) (4,2) (4,1) (7,1) (7,3) (9,3) (9,5) (8,5) (8,8) (2,8) (2,6) (5,6) (5,4) (2,4)}. In further embodiments, the feature 302C is identified using other representations such as those defined by various design formats such as GDSII, OASIS, CIF, and/or MEBES®.

Referring to block 704 of FIG. 7 and to FIG. 9, a slicing direction is selected. In FIG. 9, the X-direction is selected as the slicing direction, although the slicing direction is completely arbitrary. Referring to block 706 of FIG. 7, values along the slicing direction that have at least one vertex are identified and are designated as cut values. In the illustrated embodiment where the X-direction is selected as the slicing direction, the X values of each vertex are sorted to determine the cut values. In the embodiment, vertexes are located at X values of: 2, 4, 5, 7, and 8, and 9 which correspond to the cut values for the feature 302C. The cut values are indicated in FIG. 9 by reference lines 902.

Referring to block 708 of FIG. 7, for each cut value in the slicing direction, the feature 302C is analyzed to determine boundary segments running perpendicular to the slicing direction at that cut value. If a perpendicular boundary crosses the cut value but does not have a vertex at the cut value, an intermediate point may be recorded on the perpendicular boundary at the cut value as described below. In embodiments in which polygons are identified by an ordered set of vertex coordinates, perpendicular boundaries may be determined by finding vertex coordinate pairs with the same value in the perpendicular direction (e.g., the Y direction) that pass through the cut line. Accordingly, in one such embodiment, in block 708, the vertex coordinates are examined in sequence to determine coordinate pairs having the same value in the Y direction, where the first coordinate has an X value less than the current cut value and the second coordinate has an X value greater than the current cut value.

Figures 10, 11:
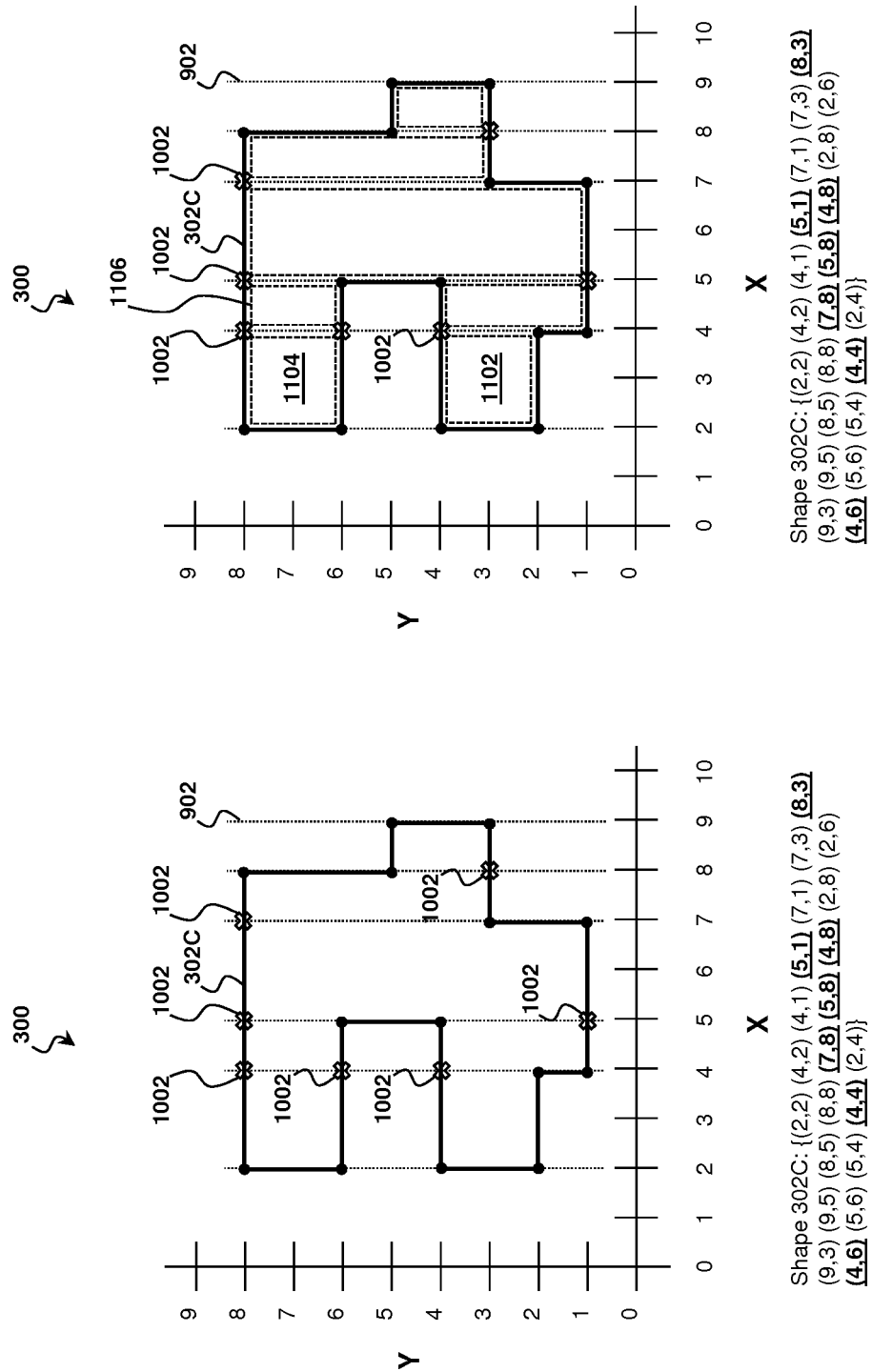

Referring to block 710 of FIG. 7 and to FIG. 10, for any perpendicular boundary that traverses a cut value, an intermediate point may be recorded at the cut value along the boundary if a vertex is not already located there. For example, in the embodiment of FIG. 10, while the feature 302C has four vertices at the cut value X=2 [(2,2) (2,4) (2,6) (2,8)], the feature 302C does not have any perpendicular boundary segment without a vertex at X=2. In contrast, feature 302C has two vertices at the cut value X=4 [(4,1) (4,2)], and has three perpendicular boundaries that traverse X=4 without a vertex at the cut value. Accordingly, intermediate points (represented by reference markers 1002) are recorded at (4,4), (4,6), and (4,8). The intermediate point coordinates may be recorded in the design database 300 or may be recorded separately. In FIG. 10, intermediate point coordinates are emphasized by underlining. The determination of block 708 and the insertion of intermediate points in block 710 may be repeated for each cut value in the slicing direction as shown in FIG. 11.

Referring to block 712 of FIG. 7 and to FIG. 11, at each cut in the slicing direction, one or more constituent rectangles are determined from the vertex coordinates and the intermediate point coordinates of the feature 302C. In an exemplary embodiment, for each cut value, the respective vertices and intermediate points are sorted by their values in the perpendicular direction. The vertex or intermediate point with the lowest value in the perpendicular direction defines the lower left corner of a rectangle extending from the current cut value to the next cut value in the slicing direction. The height of the rectangle is determined by the vertex or intermediate point having the next highest value in the perpendicular direction. If additional vertices or intermediate points remain, the vertices and/or intermediate points having odd ranks in the perpendicular direction (e.g., first, third, fifth, seventh, etc.) define lower left corners of rectangles extending from the current cut value to the next cut value in the slicing direction. The vertices and/or intermediate points having even ranks in the perpendicular direction (e.g., second, fourth, sixth, eighth, etc.) define the height of the rectangles in the perpendicular direction.

In the example of FIG. 11, the first cut value is X=2 and the next cut value is X=4. The feature 302C has four vertices at X=2 [(2,2) (2,4) (2,6) (2,8)]. The vertex with the lowest Y value is (2,2), which defines the lower left corner of rectangle 1102. Rectangle 1102 extends from the current cut value (X=2) to the next cut value (X=4) and has a height determined by the next highest coordinate point (2,4). A second rectangle 1104 has a lower left corner defined by the coordinate point with the third lowest Y value (2,6) and a height determined by the next highest coordinate point (2,8). Referring to FIG. 11, the slicing of block 712 is repeated for each cut value in the slicing direction.

Figure 12:
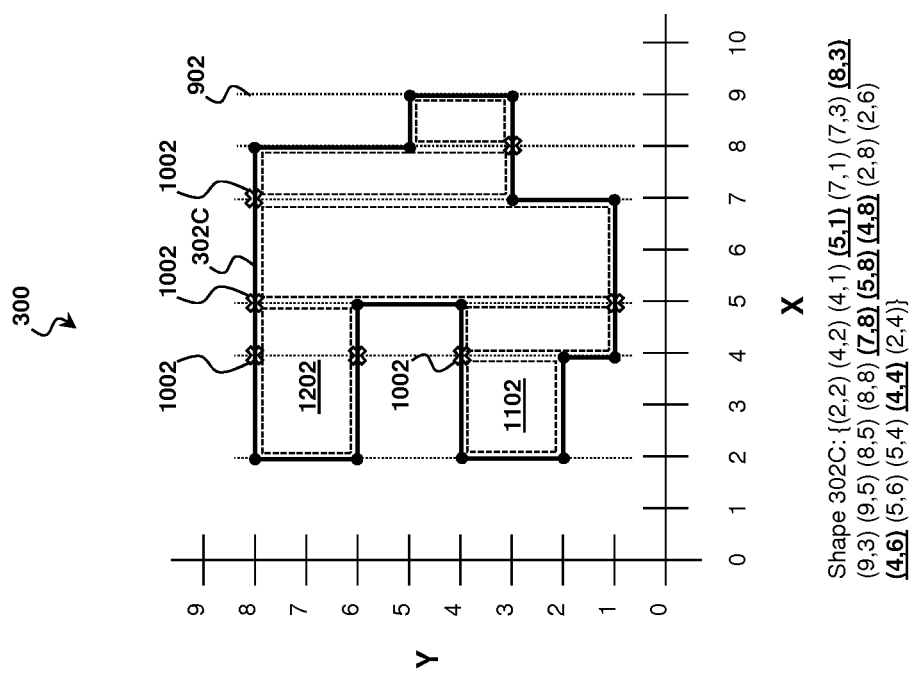

In some embodiments, it may be advantageous to identify rectangles that can be combined into larger rectangles. For example, doing so may reduce the number of comparisons made to determine an overlap area between a pixel and a polygon. Referring to block 714 of FIG. 7 and to FIG. 12, rectangles that can be combined are identified. Typically, rectangles that can be combined are adjacent and have the same maximum and minimum values in a given direction. For example, rectangles 1104 and 1106 of FIG. 11 can be combined into rectangle 1202 as shown in FIG. 12 because they are adjacent in a first direction (e.g., the X direction) and have the same maximum and minimum values in a perpendicular second direction (e.g., the Y direction). Accordingly, they may be combined into a single larger rectangle.

Referring to block 716 of FIG. 7, the constituent rectangles may be provided for use as an alternative to the corresponding polygon for use in any suitable analysis including the method 200 of FIG. 2 and the method 600 of FIG. 6.

Figure 13:
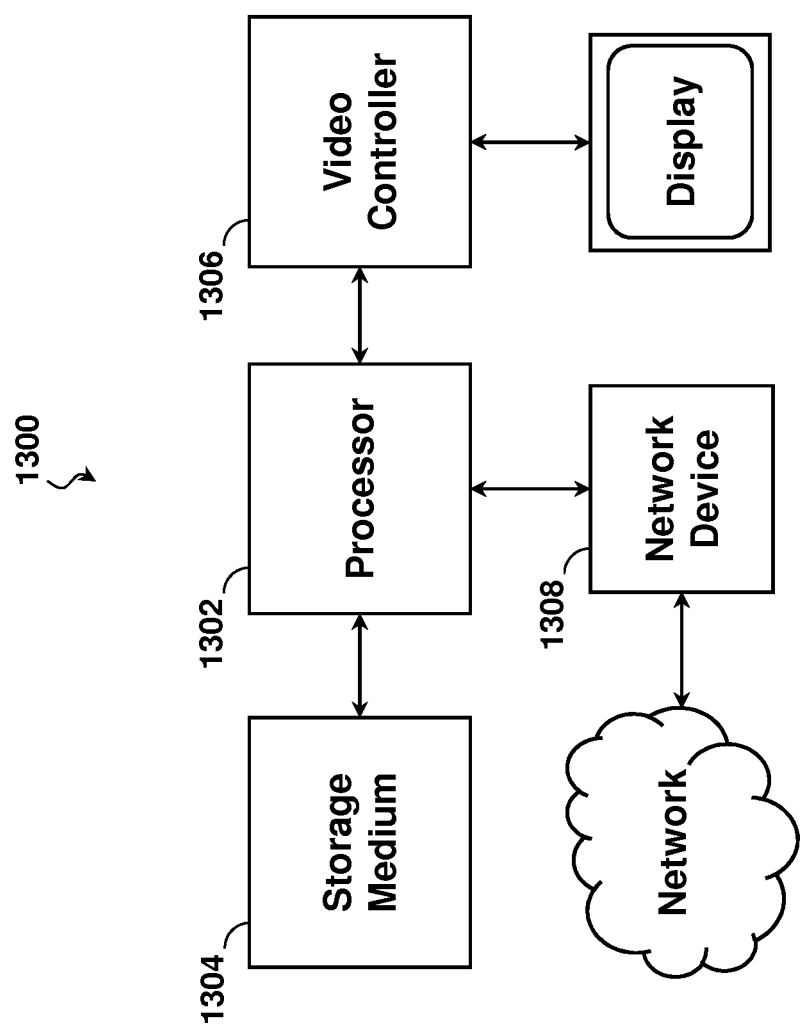
FIG. 13 is a system diagram of a computing system operable to perform the techniques of the present disclosure.

FIG. 13 is a system diagram of a computing system 1300 operable to perform the techniques of the present disclosure. The computing system 1300 may include a processor 1302 such as a microcontroller or a dedicated central processing unit (CPU), a non-transitory computer-readable storage medium 1304 (e.g., a hard drive, random access memory (RAM), a compact disk read only memory (CD-ROM), etc.), a video controller 1306 such as a graphics processing unit (GPU), and a network communication device 1308 such as an Ethernet controller or wireless communication controller. In that regard, in some embodiments, the computing system 1300 is programmable and is programmed to execute processes including those associated with rasterization and exposure intensity determination. Accordingly, it is understood that any operation of the computing system 1300 according to the aspects of the present disclosure may be implemented by the computing system 1300 using corresponding instructions stored on or in a non-transitory computer readable medium accessible by the processing system. In that regard, the computing system 1300 is operable to perform one or more of the tasks described with respect to FIGS. 2, 6, and/or 7.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

Thus, the present disclosure provides a technique for rasterizing design features by decomposing the features into their constituent rectangles. The rasterized pixels can be used to determine exposure intensities for a lithographic process. In some embodiments, the provided method includes receiving, at a computing system, a design database specifying a feature having more than four vertices. The computing system also receives a pixel grid corresponding to a lithographic system. A set of rectangles is determined that corresponds to the feature, and the computing system determines an area of the pixel grid overlapped by the feature based on the set of rectangles. A lithographic exposure intensity is determined for the pixel based on the area overlapped by the feature, and the lithographic exposure intensity is provided for patterning of the workpiece by lithographic system. In some such embodiments, a first subset of features of the design database is identified such that the features of the first subset overlap the pixel in a first direction. A second subset of features within the first subset is identified such that features of the second subset overlap the pixel in a second direction perpendicular to the first direction. The determining of the area of the pixel overlapped by the feature is based on the feature being within the second subset. In alternate embodiments, a first subset of pixels is identified such that pixels of the first subset overlap the feature in a first direction. A second subset of pixels within the first subset is identified such that pixels of the second subset overlap the feature in a second direction perpendicular to the first direction. The determining of the area of the pixel overlapped by the feature is based on the pixel being within the second subset.

In further embodiments, the provided method includes receiving, at a computing system, a design database including a feature to be formed on a workpiece. A constituent set of rectangles representing the feature is determined, and the computing system determines an exposure intensity for patterning of the workpiece based on the constituent set of rectangles. In some such embodiments, the exposure intensity corresponds to a pixel region and the determining of the exposure intensity includes: determining an amount of the pixel region overlapped by the feature using the constituent set of rectangles; and determining the exposure intensity based on the amount of the pixel region overlapped by the feature.

In yet further embodiments, the provided method of patterning a workpiece includes receiving a feature to be formed on the workpiece. A pixel grid of a lithographic system to be used to pattern the workpiece is determined. The feature is decomposed into a set of constituent rectangles, and an amount of a pixel of the pixel grid overlapped by the feature is determined using the constituent rectangles. An intensity is determined that corresponds to the pixel based on the amount of the pixel overlapped by the feature, and the workpiece is patterned according to the determined intensity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed by at least one computing system, the method comprising:
    receiving a design database specifying a polygonal feature;
    receiving a pixel grid corresponding to a lithographic system, wherein the pixel grid includes an array of pixels;
    decomposing the polygonal feature into a set of rectangles; and
    converting the polygonal feature into a map of exposure intensities based on the set of rectangles, wherein the converting includes:
        determining areas of the pixels of the pixel grid overlapped by the polygonal feature based on the set of rectangles, and
        assigning exposure intensities to the pixels of the pixel grid overlapped by the polygonal feature based on the determined areas.

2. The method of claim 1 wherein the areas of the pixels of the pixel grid overlapped by polygonal the feature is determined based on the set of rectangles using the equation:

$$A=[\min(P_{max}x, F_{max}x)-\max(P_{min}x, F_{min}x)]*[\min(P_{max}y, F_{max}y)-\max(P_{min}y, F_{min}y)],$$

where A represents an area of a pixel overlapped by a rectangle of the set of rectangles, $P_{max}x$ and $P_{max}y$ represent the maximum x and y coordinates of the pixel respectively, $P_{min}x$ and $P_{min}y$ represent the minimum x and y coordinates of the pixel respectively, $F_{max}x$ and $F_{max}y$ represent the maximum x and y coordinates of the rectangle respectively, and $F_{min}x$ and $F_{min}y$ represent the minimum x and y coordinates of the rectangle respectively.

3. The method of claim 1 further comprising patterning a workpiece based on the map of exposure intensities.

4. The method of claim 1, wherein the exposure intensities are assigned using the equation:

$$I=\lambda A,$$

where I represents an exposure intensity, A represents an area of a pixel of the pixel grid overlapped by the polygonal feature based on the set of rectangles, and λ represents a normalizing constant.

5. The method of claim 1, wherein the exposure intensities are assigned using a polynomial relationship based on an area of a pixel of the pixel grid overlapped by the polygonal feature based on the set of rectangles.

6. The method of claim 1, wherein the determining areas of the pixels of the pixel grid overlapped by the polygonal feature based on the set of rectangles includes:
    identifying a first subset of features of the design database overlapping a pixel in a first direction, wherein the determining of an area of the pixel overlapped by the polygonal feature is based on the polygonal feature being within the first subset of features.

7. The method of claim 6, wherein the determining areas of the pixels of the pixel grid overlapped by the polygonal feature based on the set of rectangles further includes:
    identifying a second subset of features of the design database overlapping the pixel in a second direction perpendicular to the first direction, wherein the identifying is performed on the first subset of features, and wherein the determining of the area of the pixel overlapped by the polygonal feature is further based on the polygonal feature being within the second subset of features.

8. The method of claim 1 wherein the determining areas of the pixels of the pixel grid overlapped by the polygonal features based on the set of rectangles includes:
    identifying a first subset of pixels of the pixel grid overlapped by the polygonal feature in a first direction, wherein the determining of an area of a pixel overlapped by the polygonal feature is based on the pixel being within the first subset of pixels.

9. The method of claim 8, wherein the determining areas of the pixels of the pixel grid overlapped by the polygonal feature based on the set of rectangles further includes:
    identifying a second subset of pixels of the pixel grid overlapped by the polygonal feature in a second direction perpendicular to the first direction, wherein the identifying is performed on the first subset of pixels, and wherein the determining of the area of the pixel overlapped by the polygonal feature is further based on the pixel being within the second subset of pixels.

10. The method of claim 1, wherein the decomposing the polygonal feature into the set of rectangles includes:
    selecting a cut direction;
    identifying cut values along the cut direction that the polygonal feature has a vertex aligned therewith;
    determining a point along a boundary of the polygonal feature extending perpendicular to the cut direction and traversing one of the cut values; and
    determining a rectangle of the set of rectangles based on the determined point.

11. A method comprising:
    receiving a design database including a feature to be formed on a workpiece;
    determining a constituent set of rectangles representing the feature;
    converting the feature into a map of exposure intensities based on the constituent set of rectangles; and
    providing the map exposure intensities to a lithographic system, such that the feature can be patterned on the workpiece, wherein the method is performed using a computing system.

12. The method of claim 11, wherein each exposure intensity corresponds to a pixel region, and wherein the converting includes determining the exposure intensity corresponding to the pixel region by:
  determining an amount of the pixel region overlapped by the feature using the constituent set of rectangles; and
  determining the exposure intensity based on the amount of the pixel region overlapped by the feature.

13. The method of claim 12 wherein the amount of the pixel region overlapped by the feature is determined using the equation:

$$A = [\min(P_{max}x, F_{max}x) - \max(P_{min}x, F_{min}x)] * [\min(P_{max}y, F_{max}y) - \max(P_{min}y, F_{min}y)],$$

where A represents the amount of the pixel region overlapped by a rectangle of the constituent set of rectangles, $P_{max}x$ and $P_{max}y$ represent the maximum x and y coordinates of the pixel region respectively, $P_{min}x$ and $P_{min}y$ represent the minimum x and y coordinates of the pixel region respectively, $F_{max}x$ and $F_{max}y$ represent the maximum x and y coordinates of the rectangle respectively, and $F_{min}x$ and $F_{min}y$ represent the minimum x and y coordinates of the rectangle respectively.

14. The method of claim 11, wherein the lithographic system performs a direct-write lithographic patterning of the workpiece using the map of exposure intensities.

15. The method of claim 12 further comprising:
  identifying a first subset of features of the design database overlapping the pixel region in a first direction, wherein the determining of the amount of the pixel region overlapped by the feature is performed based on the feature being within the first subset of features.

16. The method of claim 15 further comprising:
  identifying a second subset of features within the first subset of features, such that features of the second subset overlap the pixel region in a second direction perpendicular to the first direction, wherein the determining of the amount of the pixel region overlapped by the feature is performed further based on the feature being within the second subset of features.

17. A method of patterning a workpiece, the method comprising:
  receiving a feature to be formed on the workpiece;
  determining a pixel grid of a lithographic system to be used to pattern the workpiece;
  decomposing the feature into a set of constituent rectangles;
  determining an amount of a pixel of the pixel grid overlapped by the feature using the set of constituent rectangles;
  determining an intensity corresponding to the pixel based on the amount of the pixel overlapped by the feature; and
  patterning the workpiece according to the determined intensity.

18. The method of claim 17, wherein the amount of the pixel overlapped by the feature is determined using the equation:

$$A = [\min(P_{max}x, F_{max}x) - \max(P_{min}x, F_{min}x)] * [\min(P_{max}y, F_{max}y) - \max(P_{min}y, F_{min}y)],$$

where A represents the amount of the pixel overlapped by a rectangle of the set of constituent rectangles, $P_{max}x$ and $P_{max}y$ represent the maximum x and y coordinates of the pixel respectively, $P_{min}x$ and $P_{min}y$ represent the minimum x and y coordinates of the pixel respectively, $F_{max}x$ and $F_{max}y$ represent the maximum x and y coordinates of the rectangle respectively, and $F_{min}x$ and $F_{min}y$ represent the minimum x and y coordinates of the rectangle respectively.

19. The method of claim 17, wherein the intensity is determined by the equation:

$$I = \lambda A,$$

where I represents the intensity, A represents the amount of the pixel overlapped by the feature, and $\lambda$ represents a normalizing constant.

20. The method of claim 17, wherein the decomposing of the feature into the set of constituent rectangles includes:
  selecting a cut direction;
  determining cut values along the cut directions corresponding to at least one vertex of the feature;
  identifying a perpendicular boundary of the feature traversing the cut value;
  determining a point along the perpendicular boundary at the cut value;
  determining a rectangle of the set of constituent rectangles based on the determined point.

* * * * *